United States Patent
Soupremanien et al.

(10) Patent No.: US 9,936,608 B2
(45) Date of Patent: Apr. 3, 2018

(54) COMPOSITE HEAT ABSORPTION DEVICE AND METHOD FOR OBTAINING SAME

(71) Applicant: Commissariat A L'Energie Atomique et aux Energies Alternatives, Paris (FR)

(72) Inventors: Ulrich Soupremanien, Saint Marcellin (FR); Emmanuel Ollier, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/378,448

(22) Filed: Dec. 14, 2016

(65) Prior Publication Data

US 2017/0181318 A1   Jun. 22, 2017

(30) Foreign Application Priority Data

Dec. 17, 2015   (FR) ...................... 15 62602

(51) Int. Cl.
*H05K 7/20* (2006.01)
*F28F 21/02* (2006.01)
(Continued)

(52) U.S. Cl.
CPC .......... *H05K 7/20336* (2013.01); *B82Y 10/00* (2013.01); *C01B 32/00* (2017.08); *C09K 5/063* (2013.01); *F28F 21/02* (2013.01); *H01L 23/373* (2013.01); *H01L 23/4275* (2013.01); *F28F 2255/20* (2013.01)

(58) Field of Classification Search
CPC . H01L 23/427; H01L 23/4275; H01L 23/373; C09K 8/592; C09K 8/845; C09K 8/86; C09K 5/063; B82Y 30/00; B82Y 10/00; C01B 3/24; C01B 3/34; C01B 2203/0266; C01B 2203/1241; C01B 32/05; C01B 32/00; H05K 3/26; H05K 7/20336; H05K 832/00; F28F 21/02; F28F 2255/20
See application file for complete search history.

(56) References Cited

U.S. PATENT DOCUMENTS 6,631,755 B1 * 10/2003 Kung ...................... F28D 15/02
165/104.14
2002/0100581 A1   8/2002 Knowles et al.
(Continued)

FOREIGN PATENT DOCUMENTS

WO   WO 2008/049015 A2   4/2008
WO   WO 2013/104620 A1   7/2013

OTHER PUBLICATIONS

U.S. Appl. No. 14/009,959, filed Oct. 4, 2013, 2014/0166085 A1, Emmanuel Ollier.
(Continued)

*Primary Examiner* — Adam B Dravininkas
(74) *Attorney, Agent, or Firm* — Oblon, McClelland, Maier & Neustadt, L.L.P.

(57) ABSTRACT

Production of a heat absorption device comprising a first face intended to be in contact with a hot source and a second face opposite to the first face, a network of cells filled with a first phase change material being arranged between the first face, a passage between cells being filled with at least one second phase change material different from the first phase change material.

11 Claims, 5 Drawing Sheets

(51) Int. Cl.
*H01L 23/427* (2006.01)
*B82Y 10/00* (2011.01)
*H01L 23/373* (2006.01)
*C09K 5/06* (2006.01)
*C01B 32/00* (2017.01)

(56) References Cited

U.S. PATENT DOCUMENTS

| | | | |
|---|---|---|---|
| 2006/0151146 A1* | 7/2006 | Chou | F28D 15/02 165/10 |
| 2006/0231970 A1 | 10/2006 | Huang et al. | |
| 2007/0173154 A1* | 7/2007 | Hartmann | D02G 3/404 442/156 |
| 2009/0008779 A1 | 1/2009 | Suhir et al. | |
| 2012/0273920 A1 | 11/2012 | Fedorov et al. | |
| 2014/0043754 A1* | 2/2014 | Hartmann | H05K 7/20454 361/679.54 |
| 2014/0369005 A1* | 12/2014 | Gavillet | H01L 23/373 361/699 |
| 2016/0226042 A1* | 8/2016 | Hartmann | H01M 2/1094 |

OTHER PUBLICATIONS

U.S. Appl. No. 14/128,266, filed Feb. 25, 2014, 2014/0158334 A1, Olivier Dellea et al.
U.S. Appl. No. 14/430,762, filed Mar. 24, 2015, 2015/0243871 A1, Emmanuel Ollier.
U.S. Appl. No. 15/000,473, filed Jan. 19, 2016, 2016/0225975 A1, Emmanuel Ollier.
U.S. Appl. No. 15/000,744, filed Jan. 19, 2016, 2016/0211436, Emmanuel Ollier et al.
U.S. Appl. No. 15/000,904, filed Jan. 19, 2016, 2016/0209080 A1, Emmanuel Ollier et al.
U.S. Appl. No. 15/283,827, filed Oct. 3, 2016, Ulrich Soupremanien, et al.
French Preliminary Search Report dated Aug. 22, 2016 in French Application 15 62602, filed on Dec. 17, 2015 (with English translation of Categories of Cited Documents).
Mi Zhou et al. "Highly Conductive Porous Graphene/Ceramic Composites for Heat Transfer and Thermal Energy Storage", Advanced Functional Materials, vol. 23, No. 18, 2013, 7 pages.
Biao Wang et al. "Controllable preparation of patterns of aligned carbon nanotubes on metals and metal-coated silicon abstrates", Journal of Materials Chemistry, 2003, 3 pages.
Shadab Shaikh et al. "A carbon nanotube-based composite for the thermal control of heat loads", Carbon 50, 2012, 9 pages.

* cited by examiner

COMPOSITE HEAT ABSORPTION DEVICE AND METHOD FOR OBTAINING SAME

TECHNICAL FIELD AND PRIOR ART

The present invention relates to the implementation of an improved heat absorption device that can be used for example for the cooling of electronic components.

A greater and greater number of functionalities are confined in electronic devices. It is simultaneously sought to reduce the size of these components. This tendency leads to the necessity of having to dissipate an increasing quantity of heat per unit of volume (or mass) of component.

The problem of heat dissipation becomes of particular significance in 3D devices, the electronic components (for example memory cells) of which are distributed over several levels and dimensions or instead in electronic power devices.

Apart from the greater quantity of heat to evacuate the problem is posed of the evacuation of heat in transitory mode, when the flow of heat is relatively high and the duration of the load is relatively short.

The implementation of heat absorption devices provided with a phase change material (PCM) is known. These materials make it possible to store significant quantities of heat on account of their phase transition, typically from a solid state to a liquid state.

The document "A carbon nanotube-based composite for the thermal control of heat loads", of Shaikh et al., Carbon, Elsevier, Volume 50, Issue 2, 2012, pages 542-550 describes a thermal management device arranged between a hot source and a cold source and formed of a stack of compartments, each compartment being provided with a wall enclosing a phase change material.

Such a type of device is only suited to the thermal management of a uniform hot source.

DESCRIPTION OF THE INVENTION

It is an aim of the present invention to offer an efficient heat absorption device for evacuating heat from a non-uniform hot source and in particular formed of elements likely to undergo different heatings, this hot source being for example an electronic device with juxtaposed components having different operating temperature ranges or different critical operating temperatures. Different operating temperature ranges are taken to mean that when these components are in operation their respective dissipated powers are not the same.

According to one aspect, the present invention relates to a heat absorption device comprising cells containing a first solid/liquid phase change material, as well as a passage between cells containing a second solid/liquid phase change material, the first and the second phase change materials being distributed in a same plane parallel to a face of the heat absorption device intended to be placed in thermal contact with the hot source, for example in the form of a plurality of juxtaposed components.

An embodiment of the present invention provides a heat absorption device comprising a first face intended to be in contact with a hot source and a second face opposite to the first face, a network of cells filled with a first phase change material being arranged between the first face and the second face, at least one first cell and at least one second cell of the network being arranged in a same plane parallel to the first face, the first cell comprising a first lateral wall which extends between the first face and the second face whereas the second cell comprises at least one second lateral wall which extends between the first face and the second face, the network of cells being laid out such that a passage is provided between the first lateral wall and the second lateral wall and that this passage is filled with at least one second phase change material different from the first phase change material.

The cells filled with the first phase change material (PCM) may be provided to carry out a thermal clipping of a first element of the hot source, whereas the passage situated between the cells filled with the second phase change material (PCM) may be dedicated to carrying out a thermal clipping of a second element of the hot source having an operating temperature range different from that of the first element.

A composite structure is thus implemented with two (or more) phase change materials capable of absorbing heat by phase change enthalpy at, at least, two different temperatures.

Advantageously, the first lateral wall and the second lateral wall are formed of carbon nanotubes.

Thanks to their good thermal conductivity, the nanotubes ensure an evacuation of the heat in nominal regime by conduction. The nanotubes are preferably in contact with each other such that the walls of the cells are made of dense material.

Advantageously at least the first cell comprises several separate channels which extend between the first face and the second face and are filled with the second phase change material.

A structure with several channels per cell has notably improved mechanical strength.

Preferably, the first phase change material situated in the cells has a first melting temperature TF1 whereas the second phase change material has a second melting temperature TF2, the second melting temperature TF2 being less than the first melting temperature TF1.

The first phase change material may be an organic material. The first material is chosen preferably so as to have, in its liquid form, a low viscosity and a high affinity with the material forming the cells. "Low" viscosity is taken to mean a viscosity typically less than 1000 centipoises (cP). "High affinity" is taken to mean in particular that the material in its liquid form has good wettability, that is to say such that a contact angle typically less than 60° and in particular less than 45° is established with the material forming the cells.

Thus, the first phase change material may advantageously be a paraffin in particular when the cells are made of carbon nanotubes.

The second phase change material may be an organic or inorganic material, preferably having good thermal conductivity such as a metal material.

A structure provided with several channels per cell may make it possible to integrate an organic phase change material that is potentially not very heat conductive, the heat conduction then being realised mainly by the walls of the channels, in particular when they are made of carbon nanotubes.

According to another aspect, the present invention relates to an electronic system comprising:

at least one first electronic component forming a first heat source, at least one second electronic component forming a second heat source, at least one heat absorption device as defined previously, the first electronic component and the second electronic component being in thermal contact with the first face of the heat absorption device.

According to another aspect, the present invention relates to a method of manufacturing a heat management device as defined previously.

This method may comprise the steps of:

a) filling at least one first cell and at least one second cell of the network with the first phase change material in the liquid state thereof, then b) filling with the second phase change material in the liquid state thereof a passage situated between the first cell and the second cell.

The cells may comprise separate channels of critical dimension less than the critical dimension of the passage between the first cell and a second cell.

In this case, the selective filling of the channels by the first phase change material at step a) is facilitated.

"Critical dimension" of a pattern is herein and throughout the present description taken to mean the smallest dimension of a pattern outside of its thickness or its height.

When the first phase change material has a first melting temperature greater than the melting temperature of the second phase change material, the filling at step b) is advantageously carried out at a temperature less than the melting temperature of the first phase change material.

In this case the deterioration of the first phase change material is avoided.

Prior to step a), the method of manufacture may comprise the steps of:

definition of a pattern of the network of cells in a masking formed (in particular by photolithography) on a support, then deposition of a layer of catalyst, then removal of the masking, then growth of carbon nanotubes so as to define the network of cells with lateral walls made of carbon nanotubes.

BRIEF DESCRIPTION OF THE DRAWINGS

The present invention will be better understood on reading the description of examples of embodiment given for purely illustrative purposes and in no way limiting, and by referring to the appended drawings in which.

Moreover, in the description hereafter, terms that depend on the orientation of the device, such as "lateral", "upper", "lower", apply by considering that the structure is oriented in the manner illustrated in the figures.

Identical, similar or equivalent parts of the different figures bear the same numerical references so as to make it easier to go from one figure to the next.

The different parts represented in the figures are not necessarily according to a uniform scale in order to make the figures more legible.

DETAILED DESCRIPTION OF PARTICULAR EMBODIMENTS

An example of embodiment of a heat absorption device in accordance with the invention will now be described with reference to FIGS. 1A and 1B (giving respectively a top view and a transversal sectional view of the device).

This device is intended to be arranged on an element (not represented) called "hot source" of which it is wished to manage the heating. For example, the hot source is an electronic device provided with at least one electronic component, such as a memory, a processor, a planar or 3D integrated circuit, an electronic power component. As an example of power component may be cited notably GTO (Gate Turn-Off) type thyristors or IGBT (Insulated Gate Bipolar Transistors) or IGCT (Integrated Gate-Commutated Thyristors).

The heat absorption device has a substantially flat shape and comprises a first face 4 intended to be in contact with the hot source and a second face 6 opposite to the first face 4. The second face 6 of the heat absorption device is capable of being arranged on another element (not represented) such as a support, for example of PCB (Printed Circuit Board) type, this support being able to be itself attached to a heat dissipating device, also known as cooling device. Typically, the cooling device is a finned radiator or a structure with fluid channels. A heat flow F is thus destined to propagate from the first face 4 to the second face 6.

Figure 1A:
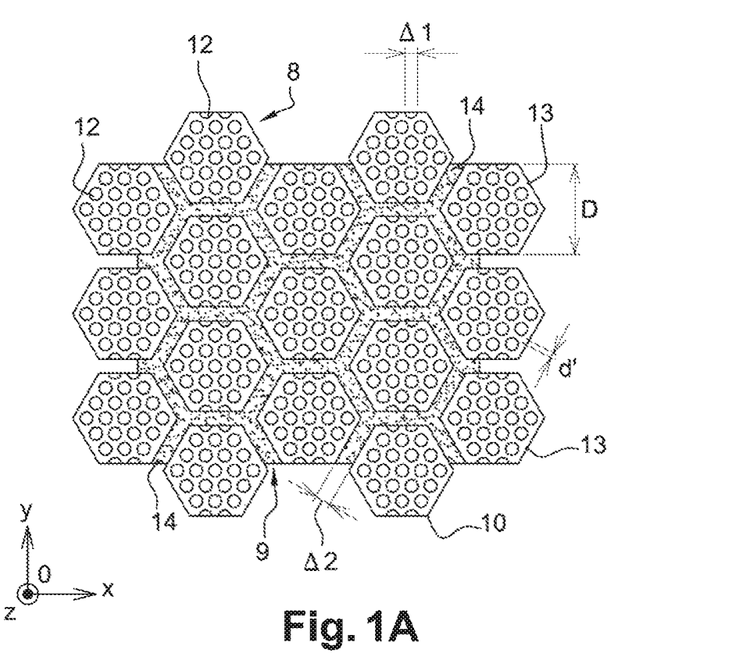
FIGS. 1A and 1B are longitudinal and transversal sectional views respectively of a schematic representation of an example of embodiment of a heat absorption device according to the invention.
Figure 1B:
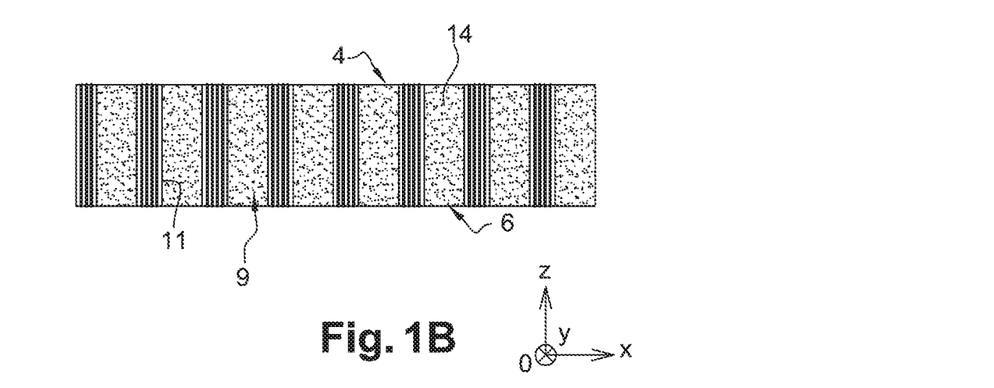

In the example of FIGS. 1A-1B, the first and second faces 4, 6 extend in a direction substantially parallel to a plane [0; x; y] of an orthogonal system [0; x; y; z].

The heat absorption device is formed of a network of separate cells 8 (also called "islands") delimited by lateral walls 10 that extend between the first face 4 and the second face 6, in this example substantially orthogonal to the first face 4 and to the second face 6. In an advantageous manner, the lateral walls 10 are made of carbon nanotubes.

They have a high coefficient of thermal conductivity, comprised for example between 6 $W.cm^{-1}.K^{-1}$ and 20 $W.cm-1.K^{-1}$. The walls 10 are formed in such a way that the nanotubes form a dense material in which the nanotubes are in contact with each other through their lateral surface.

The cells 8 are each provided with at least one cavity, also called "channel". In this example, the cells are advantageously provided with several separate channels 11 which extend parallel to the lateral walls 10 between the first face 4 and the second face 6, that is to say substantially along the direction of the heat flow. The channels 11 are produced between partitions 13 made of carbon nanotubes and form reservoirs for at least one first phase change material (PCM) 12. In the present example, the channels 11 are provided with a cylindrical shape, which, as will be seen hereafter, can make it possible to favour their filling by the first phase change material (PCM) 12.

The length of the channels 11 (measured parallel to the z axis in the example given in the figures) is substantially equal or close to that of the carbon nanotubes.

This length may be comprised for example between 5 μm and 1000 μm. The channels 11 have a critical dimension $\Delta_1$ (dimension measured parallel to the first face or to the plane [0; x; y]) which may be comprised for example between 5 μm and 50 μm, preferably of the order of 10 μm. The channels 11 may be separated from each other by a distance close to the critical dimension $\Delta_1$ of the channels, this distance being able to be comprised for example between 5 μm and 50 μm.

In the example of FIGS. 1A and 1B, the cells 8 have a hexagonal shape, the network having a honeycomb appearance. In this case, it is possible to provide cells with a section D (distance between two opposite lateral walls, that is to say between two opposite faces of the hexagon) comprised for example between 50 μm and 1000 μm, or for example of the order of 410 μm or 610 μm.

This shape of cells 8 is not exclusive, and a network in the form of square, rectangular or circular cells does not go beyond the scope of the present invention. The honeycomb structure has the advantage of offering good mechanical strength. In the example represented, the cells 8 all have the same size, however cells of different sizes and/or different shapes within the same heat absorption device could be provided.

The heat absorption device in accordance with the invention comprises at least one second phase change material 14, different from the first phase change material 12 and which is laid out around at least one cell 8 of the network. The device comprises two sets of structures 8, 9 of which one (the cells 8) is closed, the other (the passages 9) is open and interconnected, so to enable a potential circulation of phase change material.

The phase change materials 12, 14 are chosen so that they go from the solid state to the liquid state during a thermal overload of the hot source.

When this hot source is an electronic device, the first phase change material 12 and the second phase change material 14 are chosen preferably so as to have respective melting temperatures situated in a normal operating range of this electronic device intended to be placed on the first face 4.

The PCM materials 12, 14 may be chosen so as to have respective solid/liquid phase change temperatures (or melting temperatures) $T_{F1}$, $T_{F2}$, comprised for example between 30° C. and 250° C.

Preferably, the second PCM material 14 arranged in the passages 9 is provided with a melting temperature TF2 less than that TF1 of the first PCM material 12.

According to a possible configuration, a first phase change material 12 of organic nature is provided, for example of $C_xH_y$ type, and which has a good affinity with the host structure, here made of carbon nanotubes. In particular an affinity in a liquid state of the phase change material is understood. In the case notably where this host structure is made of carbon nanotubes, the first phase change material 12 may be a paraffin ($C_nH_{2n+2}$), for example such as eicosane ($C_{20}H_{42}$).

The second phase change material 14 may be of organic or inorganic nature and preferably chosen so as to have a good thermal conductivity. The second phase change material 14 may be in particular a metal material such as for example InAg or InSnZn.

A particularity of the heat absorption device is that in a same plane parallel to the first face 4 or to the second face 6 (i.e. a plane parallel to the plane [0; x; y] in FIGS. 1A, 1B), several phase change materials 12, 14 having different melting temperatures, are capable of being able to implement a clipping or a limitation of the different respective heatings undergone by different zones at the level of the first face 4.

Such a type of clipping proves useful in particular when the electronic device laid out on the first face 4 comprise several components having different dissipated power operating ranges and/or different critical operating temperatures.

The second phase change material 14 is here arranged in passages 9 situated between cells 8, that is to say in spaces delimited between the lateral walls 10 of different cells 8. The passages 9 are separated from the channels 11 by partitions made of carbon nanotubes, preferably such that the reservoirs respectively with first phase change material and with second phase change material do not communicate with each other.

The passages 9 have a critical dimension $\Delta_2$ (dimension measured parallel to the first face or to the plane [0; x; y]) provided greater than the critical dimension $\Delta_1$ of the channels 11. As will be seen hereafter, this makes it possible, during the manufacture of the device, to favour the filling of the channels 11 by the first PCM material 12.

In the example of embodiment illustrated in FIG. 1A, the layout of the passages 9 with respect to the cells 8 is such that a cell 8 provided with several channels 11 enclosing the first phase change material 12 may be entirely surrounded by a passage 9 filled with the second phase change material 14. The passages 9 between cells 8 of the network may be connected together.

An example of method of manufacturing a heat absorption device according to the invention will now be described, the steps of which are schematically represented in FIGS. 2A to 2H.

Figure 2A:
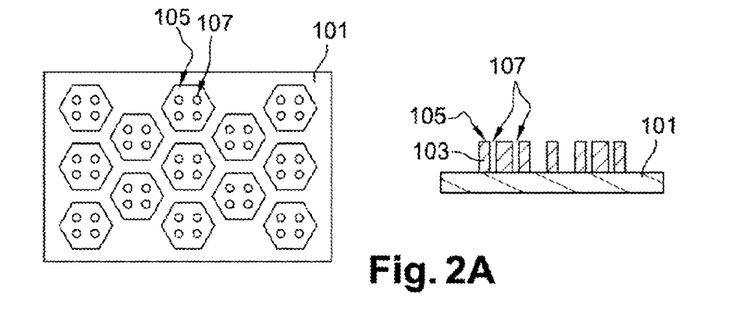
FIGS. 2A to 2H are schematic representations of steps of producing the heat absorption device when it is formed of a network of cells made of carbon nanotubes.
Figure 2B:
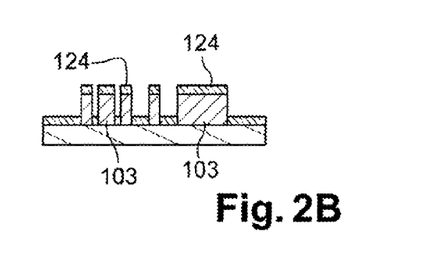

During a first step, a network of cells 105 is produced in a masking layer 103 deposited beforehand on one face of a support 101 and a lithography of the pattern to produce is carried out, for example by photolithography when the masking layer 103 is made of photosensitive resin.

In the case represented in FIG. 2A, it involves a honeycomb pattern with cells in the form of hexagonal blocks comprising vertical through holes 105.

During a following step (FIG. 2B), a deposition of a catalyst 124 is carried out for example by physical vapour deposition (PVD). The catalyst 124 is for example a layer of iron or a two-layer system comprising a layer of alumina and a layer of iron. The catalyst 124 is arranged around masking blocks, on the masking blocks and at the bottom of the vertical holes traversing these blocks.

Figure 2C:
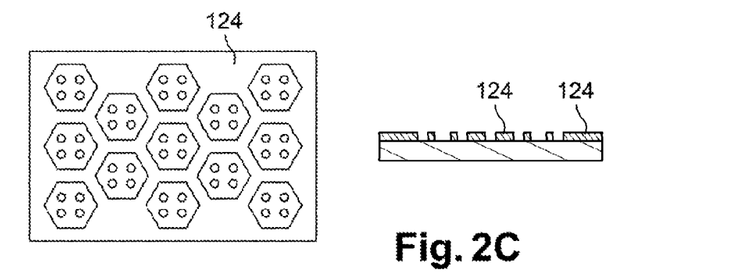

During a following step, a removal of the masking 103 is carried out, for example by means of a stripping method when it is based on resin, the catalyst areas 124 arranged directly on the support 101 being conserved (FIG. 2C).

Figure 2D:
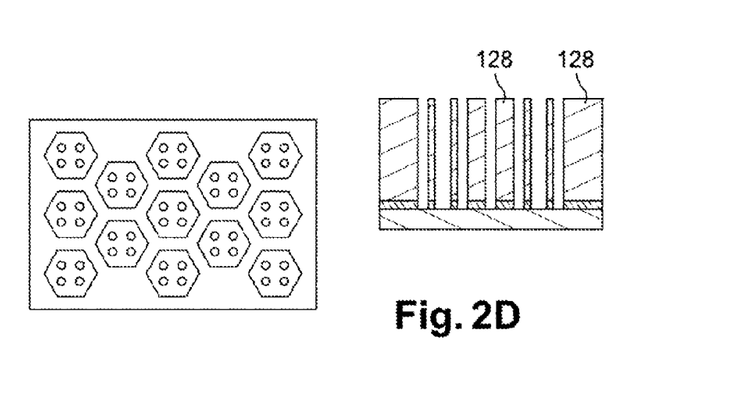

During a following step, carbon nanotubes 128 are made to grow, in particular by chemical vapour deposition with a $C_2H_2$, $H_2$, He mixture with respective gaseous flows for example of 10, 50, 50 cm$^3$/min for example at a temperature comprised between 550° C. and 750° C., and a pressure comprised for example between 0.1 mbars and 10 mbars. The height of the nanotubes is set by the growth time and may be of the order of for example one or more hundreds of micrometres (FIG. 2D).

Figure 2E:
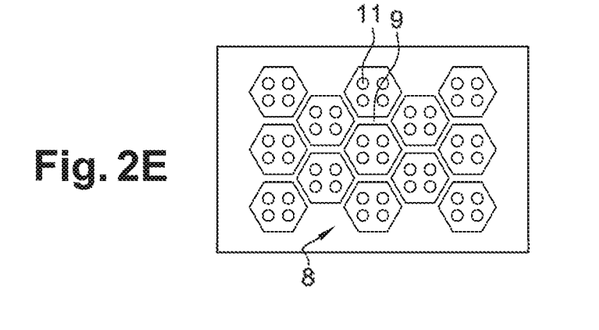

During a following advantageous step, it is possible to carry out a compaction of the tubes by immersion in a solution of alcohol. During air drying, the nanotube walls collapse and form a dense material in which the nanotubes are in contact (FIG. 2E).

A network of cells 8 or islands of carbon nanotubes comprising channels 11 are thus formed on the support 101, the cells 8 being separated from each other by spaces or passages 9 delimited between the lateral walls 10 of different cells 8.

During following steps (FIGS. 2F-2G) a filling of the channels 11 and the passages 9 by different phase change materials is carried out.

An example of filling method will now be given.

In a first step (FIG. 2F) carried out at a temperature T1 such that T1>TF1, a first phase change material 12 of melting temperature TF1 is provided in liquid or molten form on the structure made of carbon nanotubes. Preferably, the first PCM material 12 has a high affinity with this host structure and has in particular a high wettability on the nanotubes as well as a low viscosity.

Figure 2F:
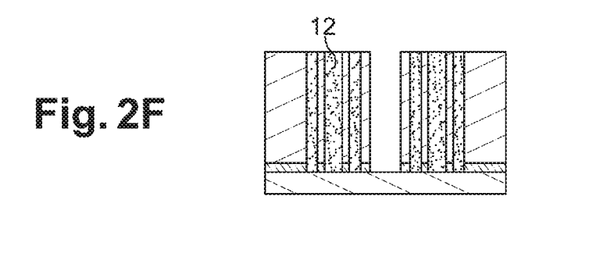

"High wettability" is taken to mean that a drop of the first PCM material 12 in a liquid state distributed on a host surface made of carbon nanotubes is such that the angle between the liquid surface and the solid surface in contact with the liquid is less than 60° and preferably less than 45°.

The first phase change material 12 in liquid form enters by capillarity and moves preferentially into the structures of smallest dimension, in particular into the channels 11 of critical dimension $\Delta_1$ where the surface energy of the liquid is minimised.

In fact, the capillary pressure Pcap may be expressed in the form:

$$Pcap = \frac{2 \times \sigma \times \cos(\theta)}{0.5\Delta 1}$$

with σ (J/m²): the surface tension of the liquid, θ: the contact angle between the host structure and the liquid and 0.5Δ1 the radius of the channels 11 forming capillaries.

Thus when θ is less than 90° the structure is called wetting and in this configuration capillary pressure preferentially carries the liquid along to the bottom of the channels 11 of critical dimension $\Delta_1$ rather than into the passages 9 of critical dimension $\Delta_2$. To enable flow in the capillaries, a liquid of low viscosity is chosen, that is to say less than 1000 cP and comprised advantageously between 1 and 10 cP.

The quantity of the first phase change material 12 provided to carry out the filling is calculated so as to fill preferably only the volumes of the channels 11, whereas the larger spaces or inter-cell 8 passages 9 are left empty after having served as transport paths.

The control of this filling is linked to the quantity of phase change material 12 that is introduced, this being provided by means of an estimation of the level of vacuum of the host structure and in particular the volume of the channels 11. This estimation may be made by means of one or more images obtained for example by microscope of the network of empty cells, then from a calculation of the size of the channels 11 from this or these images. An image analysis makes it possible to calculate a vacuum surface then this value is multiplied by the height of the structure in order to estimate a volume. Once this volume has been estimated, the mass of phase change material 12 to provide is deduced therefrom, this PCM material 12 being weighed then melted on the network of cells.

After filling of the channels 11 by the first phase change material 12, it is possible to re-establish a surrounding temperature to the network of cells 8 less than TF1 such that the first phase change material recovers its solid state.

Figure 2G:
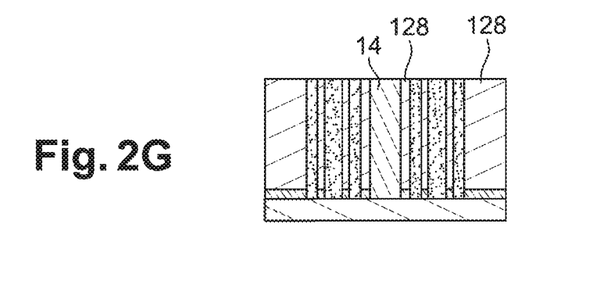

Then, secondly, the second phase change material 14 of melting temperature TF2 less than that of the first material 12 is arranged in liquid or molten form on the host structure.

This method is carried out at a temperature T comprised between the melting temperature TF2 of the second phase change material and that TF1 of the first phase change material, so as to make liquid or maintain in liquid form the second phase change material 14, while keeping the first phase change material 12 in its solid form. Thus, the second phase change material 14 is introduced into the spaces or passages 9 between cells 8.

The assembly thus obtained is a composite network formed of a heat conducting structure, for example made of carbon nanotubes with one or more cells 8 provided with vertical channels 11 which extend in the direction of the nanotubes and are filled with the first phase change material 12 of solid-liquid state change temperature TF1, and at least one passage 9 between cells 8 filled with the second phase change material 14 of solid-liquid state change temperature TF2.

Figure 2H:
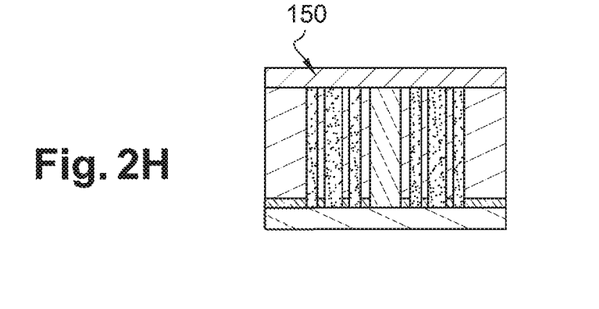

The support 101 on which the nanotubes are built can serve to close a first end of the channels 11 and passages 9 filled with phase change material, whereas a second end may be closed by means of a cover 150 transferred onto the structure (FIG. 2H). The cover 150 may be for example made of copper.

The heat absorption device may itself then be transferred onto an electronic device.

Figure 3:
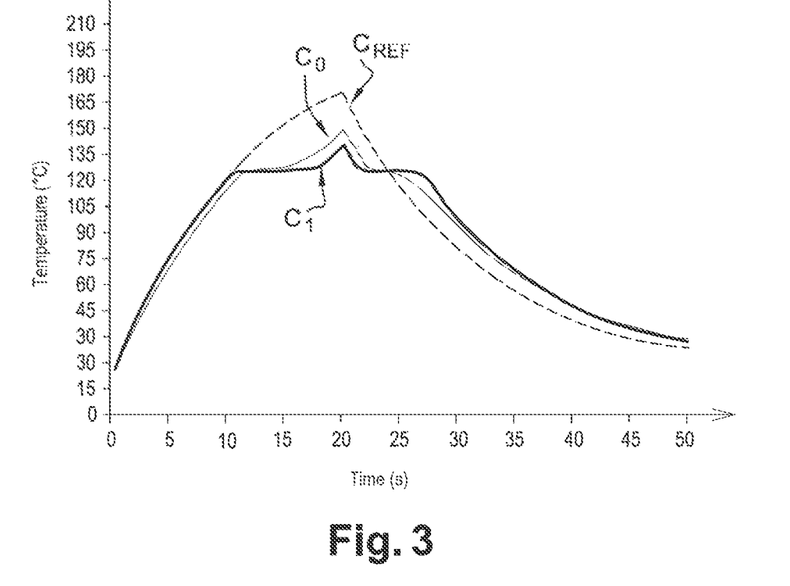
FIG. 3 is a time-temperature curve serving to illustrate the performances of a device provided with several phase change materials.

In FIG. 3, a time-temperature curve $C_1$ serves to illustrate the performances of a particular example of embodiment of the heat absorption device.

In this example, the first phase change material 12 is A144™ developed by PCMPRODUCTS whereas the second phase change material 14 is made of InAg. The conductive host structure made of carbon nanotubes is here closed by two wafers of copper arranged on an upper face and a lower face of the network. These wafers form the first face and the second face of the heat absorption device. The hot source, with which the device is here placed side by side, has a uniform dissipated power on the first face of the heat absorption device which is of the order of 3 W/cm². As a comparison, curves $C_{ref}$ (in dashed lines) and $C_0$ are given. The curve $C_{ref}$ was obtained by means of a structure constituted of copper wafers arranged respectively on an upper face and a lower face of a silicon wafer. The curve $C_0$ illustrates for its part the performances of an absorption device formed of a structure made of carbon nanotubes as described previously with reference to FIGS. 1A-1B, but in which a single phase change material is integrated in the channels and the inter-cell passages.

It thus may be observed that with the heat absorption device in accordance with the invention, the maximum temperature value is lowered compared to the case where only one phase change material is integrated.

The second metal phase change material 14 may have a density of around 8000 kg/m³ whereas the first phase change material 12 of organic nature may have a density of around 800 kg/m³.

Yet, if the latent heat of the second material 14 is 34 J/g compared to a first material 12 of 200 J/g then for a same given available volume (for example 10 mm³), the energy that the first material 12 may store is 160 J whereas the energy that the second material 14 may store is 272 J.

With the device integrating several phase change materials, better thermal clipping is consequently achieved.

A heat absorption device in accordance with the invention is particularly suited to a non-uniform hot source, that is to say of which the dissipated power is not the same over the entire first face of the device.

Figure 4:
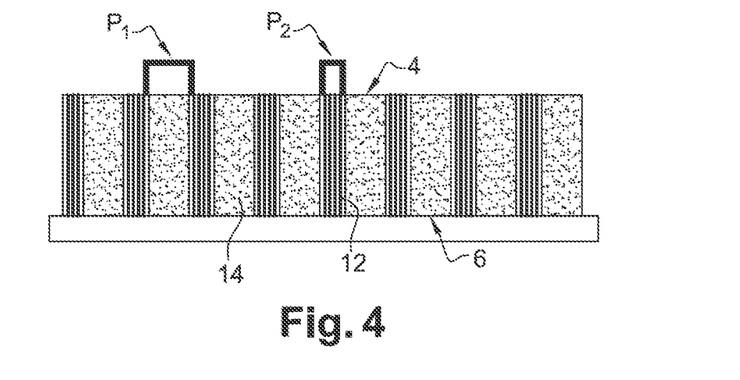
FIG. 4 is a sectional view of an example of system provided with a heat absorption device with several phase change materials according to the invention on one face of which several electronic components having different operating ranges and different critical operating temperatures are laid out.

The device of FIG. 4 illustrates a layout with a hot source formed of elements having different respective heat dissipations arranged on a same face of the heat absorption device.

The hot source includes a first component (or a first chip) P1 arranged on the first face 4 of the heat absorption device and in particular on a passage forming a reservoir for the second phase change material 14. A second component (or a second chip) P2 is also arranged on the channels 11 forming a reservoir for the first phase change material 12. The first component P1 and the second component P2 have different dissipated powers and/or different critical operating temperatures. Thus each chip or electronic component is transferred above a reservoir of phase change material dedicated to its own thermal clipping.

The second component P2 that generates the most heat is transferred above the cells 8 formed of conductive structures made of nanotubes and vertical channels filled with the first phase change material 12, whereas the first component P1 which generates less heat is transferred onto a surface situated facing the inter-cell passages 8 (inter-islands) filled with the second phase change material 14.

Figure 5:
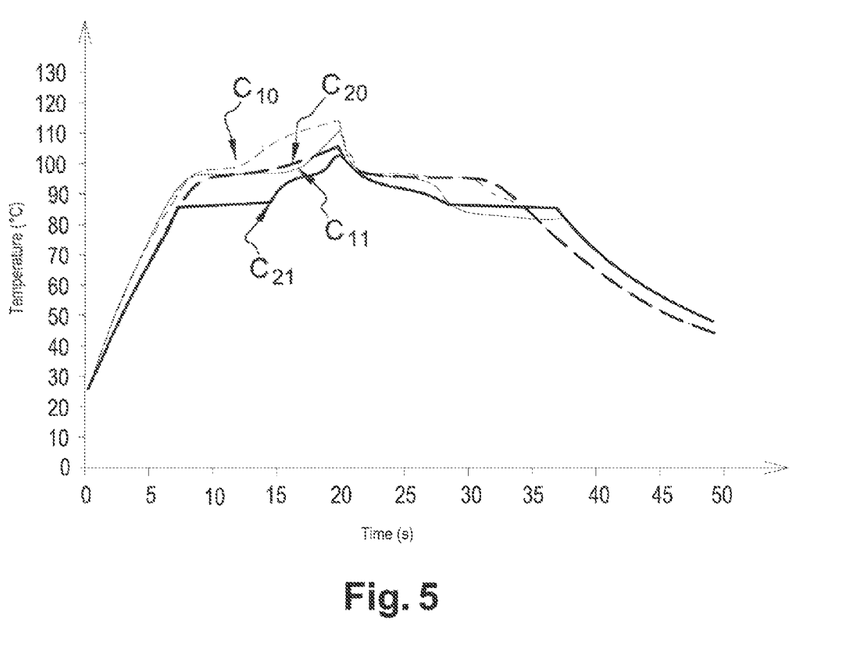
FIG. 5 serves to illustrate the performances of such a system in comparison with a device integrating a single phase change material.

FIG. 5 serves to illustrate the performances of such a system in which the pairing of PCM materials is provided with respective melting temperatures TF1, TF2 of the first phase change material and of the second phase change material 12, 14 which differ from each other by at least 10° C.

The time-temperatures curves $C_{11}$, $C_{21}$ are representative of measurements carried out respectively with a system as described above in which the second component P2 generates a heat flow of the order of 4 W/cm$^2$ whereas the first component P1 generates a heat flow of the order of 1 W/cm$^2$.

The melting temperatures TF1 and TF2 of the first phase change material 12 and of the second phase change material 14 are comprised respectively between 95-97° C. and 85-87° C.

As a comparison, the curves $C_{10}$, $C_{20}$ are representative of measurements carried out respectively on a system similar to that of FIG. 4 but integrating a single phase change material.

In the example presented, it is sought to be in conditions such that the second component P2 (curves $C_{10}$ and $C_{11}$) does not undergo a temperature of more than 110° C. for more than 5 seconds and that the first component P1 (curves $C_{20}$ and $C_{21}$) does not undergo a temperature of more than 95° C. for more than 10 seconds.

The system configured with two phase change materials (curves $C_{11}$ and $C_{21}$) makes it possible to meet these criteria depending on the specifications of the components P1, P2. On the other hand, the configuration with a single phase change material (curves $C_{10}$ and $C_{20}$) does not enable this since the temperatures remain too high.

In one or the other of the examples of embodiment that have just been described two different phase change materials PCM are integrated in two separate enclosures situated in a same plane parallel to the first face of the network of cells.

It is also possible to integrate a number of phase change materials greater than two while taking into account for example the different number of components that it is wished to arrange on one face of the device.

The examples of embodiment that have just been given concern a host structure of phase change materials which is made of carbon nanotubes. A similar network structure made of another material, for example silicon, does not go beyond the scope of the present invention. In this case, the cells may be defined by an etching method of DRIE (Deep Reactive Ion Etching) type.

The heat absorption device with several phase change materials according to the invention makes it possible to thermally manage transitory or intermittent heat sources, and are suited in particular to 3D electronic devices, that is to say the components of which are distributed over three dimensions. Such devices are for example provided with several levels of superimposed transistors.

The invention claimed is:

1. A heat absorption device comprising a first face intended to be in contact with a hot source and a second face opposite to the first face, a network of cells filled with a first phase change material being arranged between the first face and the second face, at least one first cell and at least one second cell of the network being arranged in a same plane parallel to the first face, the first cell comprising a first lateral wall which extends between the first face and the second face whereas the second cell comprises at least one second lateral wall which extends between the first face and the second face,
   the network of cells being laid out such that a passage is provided between the first lateral wall and the second lateral wall and that this passage is filled with at least one second phase change material different from the first phase change material.

2. The heat absorption device according to claim 1, wherein the first lateral wall and the second lateral wall are formed of carbon nanotubes.

3. The heat absorption device according to claim 1, wherein at least the first cell comprises several separate channels which extend between the first face and the second face parallel to the first lateral wall.

4. The heat absorption device according to claim 1, wherein the first phase change material has a first melting temperature and in which the second phase change material has a second melting temperature, the second melting temperature being less than the first melting temperature.

5. The heat absorption device according to claim 1, wherein the first phase change material is a paraffin.

6. The heat absorption device according to claim 1, the second phase change material being metal.

7. An electronic system comprising:
   at least one first electronic component forming a first heat source,
   at least one second electronic component forming a second heat source,
   at least one heat absorption device according to claim 1, the first electronic component and the second electronic component being in thermal contact with the first face of the heat absorption device.

8. A method of manufacturing a heat absorption device according to claim 1, including:
   filling at least one first cell and at least one second cell of the network with a first phase change material in the liquid state thereof,
   filling a passage situated between the first cell and the second cell with a second phase change material in the liquid state thereof.

9. The method according to claim 8, in which the first cell comprises several separate channels, the channels having a critical dimension less than a critical dimension of the passage between the first cell and a second cell.

10. The method according to claim 8, in which the first phase change material has a first melting temperature greater than the melting temperature of the second phase change material, the filling being carried out at a temperature less than the melting temperature of the first phase change material.

11. The method according to claim 8, including prior to the filling of at least the first cell and to the filling of said passage, the steps of:
- definition of a pattern of the network of cells in a masking formed on a support, then
- deposition of a layer of catalyst, then
- removal of the masking, then
- growth of carbon nanotubes so as to define the network of cells with lateral walls made of carbon nanotubes.

* * * * *